(12) United States Patent
Alshinnawi et al.

(10) Patent No.: US 8,830,672 B2
(45) Date of Patent: Sep. 9, 2014

(54) COMPUTER SYSTEM COOLING USING AN EXTERNALLY-APPLIED FLUID CONDUIT

(75) Inventors: Shareef F. Alshinnawi, Durham, NC (US); Gary D. Cudak, Creedmoor, NC (US); Christopher J. Hardee, Raleigh, NC (US); Randall C. Humes, Raleigh, NC (US); Adam Roberts, Moncure, NC (US); Edward S. Suffern, Chapel Hill, NC (US); J. Mark Weber, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 13/560,617

(22) Filed: Jul. 27, 2012

(65) Prior Publication Data

US 2014/0029193 A1  Jan. 30, 2014

(51) Int. Cl.
*G06F 1/20* (2006.01)
*H05K 7/20* (2006.01)

(52) U.S. Cl.
CPC .............. *G06F 1/20* (2013.01); *H05K 7/20736* (2013.01); *H05K 7/20* (2013.01)
USPC .............. 361/679.47; 361/679.5; 361/679.53; 361/688; 361/689; 361/695; 361/698; 361/699; 361/714; 361/715; 165/80.2; 165/104.33; 165/122

(58) Field of Classification Search
CPC ........ G06F 1/20; H05K 7/20; H05K 7/20736; H05K 7/20836; H05K 7/20909; H01L 23/473; H01L 23/467
USPC ....................... 361/679.46–679.53, 688–699, 361/714–727; 165/80.2, 80.3, 80.4, 80.5, 165/104.18, 104.19, 104.22, 104.28, 165/104.33, 104.34, 121–126; 62/259.2; 454/184
See application file for complete search history.

(56) References Cited

U.S. PATENT DOCUMENTS

| | | | |
|---|---|---|---|
| 4,485,429 A * | 11/1984 | Mittal | 361/718 |
| 5,161,089 A | 11/1992 | Chu et al. | |
| 5,671,122 A | 9/1997 | Schoettl et al. | |
| 6,594,149 B2 | 7/2003 | Yamada et al. | |
| 6,990,817 B1 * | 1/2006 | Bhatia | 62/5 |
| 7,061,761 B2 | 6/2006 | Tucker et al. | |
| 7,095,612 B2 | 8/2006 | Beihoff et al. | |
| 7,116,553 B2 | 10/2006 | Bleau et al. | |
| 7,254,024 B2 * | 8/2007 | Salmon | 361/699 |
| 7,355,277 B2 | 4/2008 | Myers et al. | |
| 7,382,613 B2 | 6/2008 | Vinson et al. | |
| 7,539,020 B2 | 5/2009 | Chow et al. | |
| 7,688,584 B1 * | 3/2010 | Becklin | 361/694 |
| 7,816,786 B2 | 10/2010 | Nakatsu et al. | |
| 7,821,785 B1 | 10/2010 | Neumann | |

(Continued)

*Primary Examiner* — Michail V Datskovskiy
(74) *Attorney, Agent, or Firm* — Katherine S. Brown; Jeffrey L. Streets

(57) ABSTRACT

A computer system includes a rack-mountable server unit with a closed server housing. The server housing has a channel with a recessed channel wall in conductive thermal communication with a processor or other heat-generating component. An elongate conduit is received into the channel of the server housing in conductive thermal communication with an external surface of the server housing. The server is cooled by conductive fluid flow through the conduit, with no appreciable airflow through the server housing. The system may be operated in an optional burst cooling mode, wherein a volume of cooling fluid is trapped in the conduit for a period of time before being quickly released.

16 Claims, 6 Drawing Sheets

FIG. 2

(56) References Cited

U.S. PATENT DOCUMENTS

| | | | |
|---|---|---|---|
| 7,848,105 B2 | 12/2010 | Holmes et al. | |
| 7,911,793 B2* | 3/2011 | Attlesey | 361/699 |
| 8,059,401 B2 | 11/2011 | Guan | |
| 8,345,419 B2* | 1/2013 | Sun | 361/679.49 |
| 2004/0004817 A1* | 1/2004 | Greco | 361/697 |
| 2005/0199372 A1 | 9/2005 | Frazer et al. | |
| 2008/0239659 A1* | 10/2008 | Kundapur | 361/687 |
| 2009/0002945 A1 | 1/2009 | Kenny | |
| 2009/0159241 A1* | 6/2009 | Lipp et al. | 165/80.2 |
| 2010/0328889 A1 | 12/2010 | Campbell et al. | |
| 2011/0085296 A1 | 4/2011 | Rubenstein et al. | |
| 2012/0123595 A1* | 5/2012 | Bower et al. | 700/282 |
| 2013/0025818 A1* | 1/2013 | Lyon et al. | 165/11.1 |

\* cited by examiner

COMPUTER SYSTEM COOLING USING AN EXTERNALLY-APPLIED FLUID CONDUIT

BACKGROUND OF THE INVENTION

1. Field of the Invention

The present invention relates to cooling systems for computers.

2. Background of the Related Art

Computer systems include electronic components, such as processors and system memory, that generate heat as a result of consuming electrical power. An active cooling system is included on many computer systems for removing heat, to prevent the electronic components from reaching excessive temperatures. Smaller computer systems, such as a desktop and laptop computers, typically include one or more onboard cooling fan to generate airflow through the computer. A larger computer system, such as a rack-based system in a data center, commonly includes multiple rack-mounted servers and equipment along with a rack-mounted blower unit for forcing airflow through the servers. These cooling systems generate airflow that passes directly over the internal, heat-generating components. Such computer systems must be periodically serviced, such as for removing excessive dust that accumulates inside.

BRIEF SUMMARY OF THE INVENTION

One embodiment of a rack-mounted computer system has at least one rack-mountable server having a system board with at least one processor and an enclosed server housing containing the system board. The server housing comprises a channel including a channel wall in conductive thermal communication with the processor. An elongate conduit comprises a thermally conductive material defining an internal fluid flow passage. The elongate conduit is received in the channel of the server housing with the elongate conduit in conductive thermal communication with an external surface of the channel wall.

Another embodiment of a computer system includes a plurality of servers, each server comprising a system board with at least one processor and a server housing enclosing the system board. A chassis is provided for receiving one or more instances of the server. An elongate conduit comprises a thermally conductive material defining an internal fluid flow passage. The server housing is not required to have a channel in this embodiment, but the elongate conduit is still in conductive thermal communication with an external surface of each server housing. A cooling fluid mover is configured for providing forced convection of a cooling fluid through the elongate conduit at a sufficient flow rate to cool the plurality of servers without any appreciable airflow into the plurality of servers.

DETAILED DESCRIPTION OF THE INVENTION

A cooling system and related method of operation are disclosed, wherein rack-mounted servers may be cooled entirely by a network of fluid conduit externally engaging the server housings. In one embodiment, each server housing comprises a thermally conductive material and defines a channel for receiving a section of conduit. The channel on the server housing includes a recessed channel wall that passes closely to a processor or other heat-generating component. Any space between the processor and the recessed channel wall and any space between the channel wall and the fluid conduit may be filled with a heat-conducting material. Heat is thereby transferred substantially entirely by conduction from the processor to the channel wall and from the channel wall to the received conduit. A cooling fluid is made to flow through the fluid conduit to remove the heat by forced convection. By cooling the servers using the externally-routed fluid conduits, no airflow is required internally to the servers. The server housings are closed, and may even be sealed, to prevent the intrusion of dust and other contaminants. By virtually eliminating airflow through the servers, this system and related methods of operation reduce maintenance requirements and enhance the longevity of the servers. The elimination of air openings in the server housing may also reduce emissions of electromagnetic interference (EMI).

Figure 1:
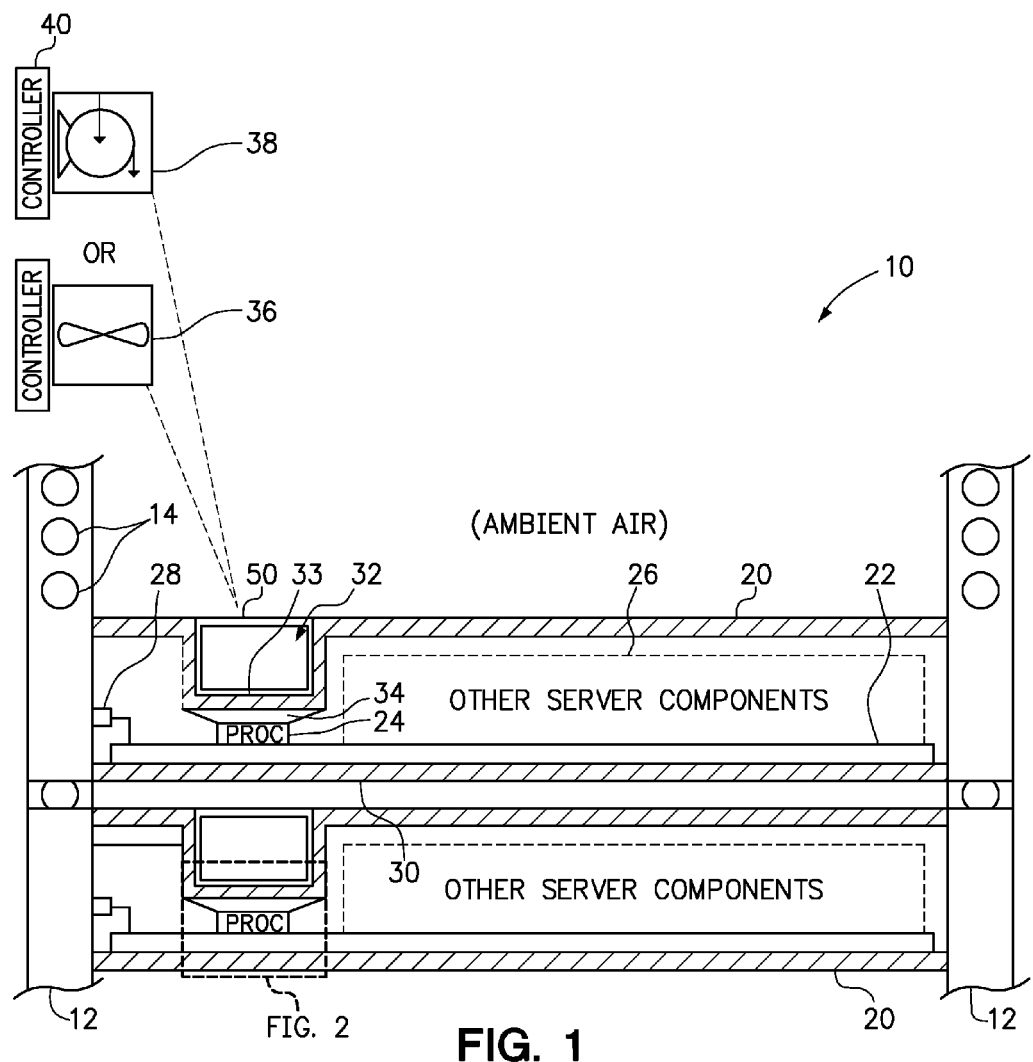
FIG. 1 is a front-facing elevation view of a computer system embodiment in which a plurality of servers is convectively cooled by fluid conduits externally engaging the rack-mounted servers.

FIG. 1 is a front-facing elevation view of a rack-mount computer system embodiment 10 in which a plurality of servers 20 are convectively cooled by fluid conduits 50 externally engaging the rack-mounted servers 20. The servers 20 in this embodiment are individually mounted on vertical rails 12 of a rack. The servers 20 and the rails 12 may be configured to comply with industry rack standards, such as a 19-inch rack standard. A typical 19-inch rack may include up to 42U (i.e. forty-two rack units) of servers 20 and supporting electronic equipment. According to such a standard, the vertical rails 12 may have a rail spacing and the servers 20 may have corresponding outer dimensions (height, width, depth) so that the servers 20 can be readily supported on mounting holes 14 provided on the rails 12. Each server 20 in this embodiment is, by way of example, a 1U system, with a system board 22 having at least one processor 24. The system board 22 is the primary circuit board in each server 20. In addition to the at least one processor 24, each server 20 may include a plurality of other server components 26 such as primary memory (RAM), interrupt controllers, BIOS, drive controllers, video controllers, as well as electronic connectors for interfacing with additional components. With each server 20 having at least one processor 24 along with other components 20, each server 20 is configurable either as an independent system or as a node of a network. The computing resources of the multiple servers 20 in the rack are typically aggregated by networking or otherwise interconnecting the servers 20.

Each server 20 includes a server housing 30 that is closed and that fully encloses the system board 22. The closed server housing 30 prevents any appreciable airflow into the server 20, to prevent dust and other contaminants from entering the server 20. With no airflow available internally to cool the servers 20, the servers 20 are instead cooled by convective (forced) fluid flow through the externally-routed, elongate fluid conduits 50 that thermally engage an exterior surface of the server housings 30. Each server housing 30 defines an optional channel 32 for receiving a respective conduit 50. An inner profile of the channel 32 matches an outer profile of the conduit 50. By way of example, the outer profile of the conduit 50 is generally rectangular and the inner-profile of the channel 32 in this embodiment is generally U-shaped. The U-shaped channel 32 positions the conduit 50 close to the heat-generating component to be cooled, which in this case is the processor 24. The U-shaped channel 32 may also encompass the conduit 50 in the server housing 30 so that the conduit 50 may be flush with, or at least does not stick out beyond, an outer surface of the server housing 30. The portion of the channel 32 that passes most closely to the processor 24 is a recessed channel wall 33, which is in close proximity or in direct contact with the processor 24.

The processor 24 is in conductive thermal communication with an interior surface of the recessed channel wall 33. The respective fluid conduit 50 is in conductive thermal communication with an exterior surface of the recessed channel wall 33. In this embodiment, a thermally conducting structure, i.e. a thermal bridge 34 (See FIG. 2), fills a slight gap between the processor 24 and the recessed channel wall 33, although an alternative configuration would be to have the recessed channel wall 33 directly contact the processor 24. The fluid conduit 50 and the server housing 30 may both comprise a thermally conductive material such as aluminum, at least at an interface between the recessed channel wall 33 and the fluid conduit 50 to facilitate heat conduction from the processor 24 to the server housing 30 and at an interface between the server housing 30 and the fluid conduit 50 to facilitate heat conduction from the server housing to the fluid conduit 50. To provide this conductive thermal communication, these components may directly contact one another. Any gap between the processor 24 and an interior surface of the recessed channel wall 33 and a gap between an exterior surface of the recessed channel wall 33 and the fluid conduit 50 may be filled with a thermally-conductive structure. An example of a thermally conductive gap-filling structure is further described below in FIG. 2. Since no cooling fluid enters the server housing 30, the mode of cooling for the processor 24 is a combination of heat conduction from the processor 24 to the server housing 30, heat conduction from the server housing 30 to the fluid conduit 50, and forced convection is provided only through the externally-applied conduit 50 for removing heat.

The cooling fluid that is made to flow through the conduit 50 for the purpose of cooling the servers 20 may be air, or it may be a liquid such as water. Both options are indicated schematically in FIG. 1 by a choice of a fan module 36 or a liquid pump 38 as a cooling fluid mover. Either air or liquid may be selected as the cooling fluid depending on the particular application. Air may be a good choice for the cooling fluid in some instances because air may be easily supplied at low cost, such as by ambient air. The ambient air may be cooled by a computer room air conditioning (CRAC) system as optionally supplied to cold aisles in a data center. Water or other liquid may be desired as the cooling fluid in other applications for the generally higher volumetric heat capacity and corresponding cooling potential of a liquid as compared with air. The water may be chilled by a machine, such as a building chiller unit that provides a steady supply of chilled water. The chilled water may also be supplied to a rear-door heat exchanger on this or another rack, although a system having a conduit 50 as shown may desirably avoid the need for traditional rear-door heat exchangers or chassis blower modules.

Whatever the choice of cooling fluid, the cooling fluid source is placed in fluid communication with the fluid conduit 50 and the cooling fluid is forcibly moved through the conduit 50 by a powered cooling fluid mover. Typically one or the other of the fan module 36 for use with air and the liquid pump 38 for use with a liquid cooling fluid will be used. The fan module 36 or the liquid pump 38 may be positioned inside the conduit 50 with an outer profile of the fan module 36 or a housing of the liquid pump 38 matching the inner profile of the conduit 50 to be sealed with the fluid conduit 50. Alternatively, the fan module 36 or liquid pump 38 may be structurally separate from the conduit 50 and placed in fluid communication with the conduit 50 using a tubing, hose or duct connection. Alternatively, the liquid pump 38 may be structurally separate from the conduit 50, particularly where the infrastructure of a datacenter or building provides an existing source of a pressurized liquid such as a chiller having a pump for pressurizing the liquid. If desired, the fan module 36 may be a blower module that is structurally separate from the fluid conduit 50.

A controller 40 is provided for controlling the fluid flow rate. Generally, increasing the fluid flow rate (air or liquid) through the conduit 50 increases the maximum rate of cooling to the processor 24, and decreasing the fluid flow rate through the conduit 50 decreases the maximum rate of cooling to the processor 24. The controller 40 may dynamically select the fluid flow rate to be enforced by the fan module 36 or liquid pump 38. In the case of the fan module 36, the controller 40 may control the magnitude of power supplied to a fan motor, such as by controlling a fan speed for enforcing a dynamically selected fluid flow rate (described further below). In the case of the liquid pump 38, the controller 40 may control the flow rate by controlling a pump speed. The controller 40 may also include or cooperate with a system of valves, and the flow rate may be controlled in part by controlling a valve opening to vary the fluid pressure and corresponding flow rate.

The controller 40 may comprise hardware and software elements residing in each server 20, on a rack-mounted management module external to the servers 20, and/or in an electronic control element remote from the rack and servers 20. The embodiment of FIG. 1 has an electrical connector 28 that can be used to communicate between the system board 22 inside the server 20 to components of the controller 40 external to the server 20. The electrical connector 28 includes one or both of a power connection and a data connection that may include electrical wires passing through the server housing 30. A sealed connector type may be used to prevent the intrusion of air through the connector into the server housing 30. Components of the controller 40 may include a control element on the system board 22 (i.e. a system board controller). The system board controller may include the processor 24 and control logic executable by the processor 24 for dynamically selecting a cooling fluid flow rate according to a system parameter. For example, the system board 22 may include a temperature sensor, which may be embedded within the processor 24 for sensing a system temperature or processor temperature, and the control logic may be used for selecting a fluid flow rate as a function of the measured temperature. Other examples of a system parameter include a workload or measured power consumption, wherein the heat produced by the servers 20 is generally in relation to the workload or power consumption. The fluid flow rate may be dynamically selected by the control element on the system board 22, and flow rate control signals may be transmitted via the electrical connector 28 to the fluid mover (e.g. fan module 36 or pump 38) for enforcing the cooling fluid flow rate selected by the system board controller. Further elements of the controller 40 may include a control circuit or control logic external to the server 20, such as an electronic fan controller or pump controller used to select and/or enforce the dynamically selected fluid flow rate.

Figure 2:
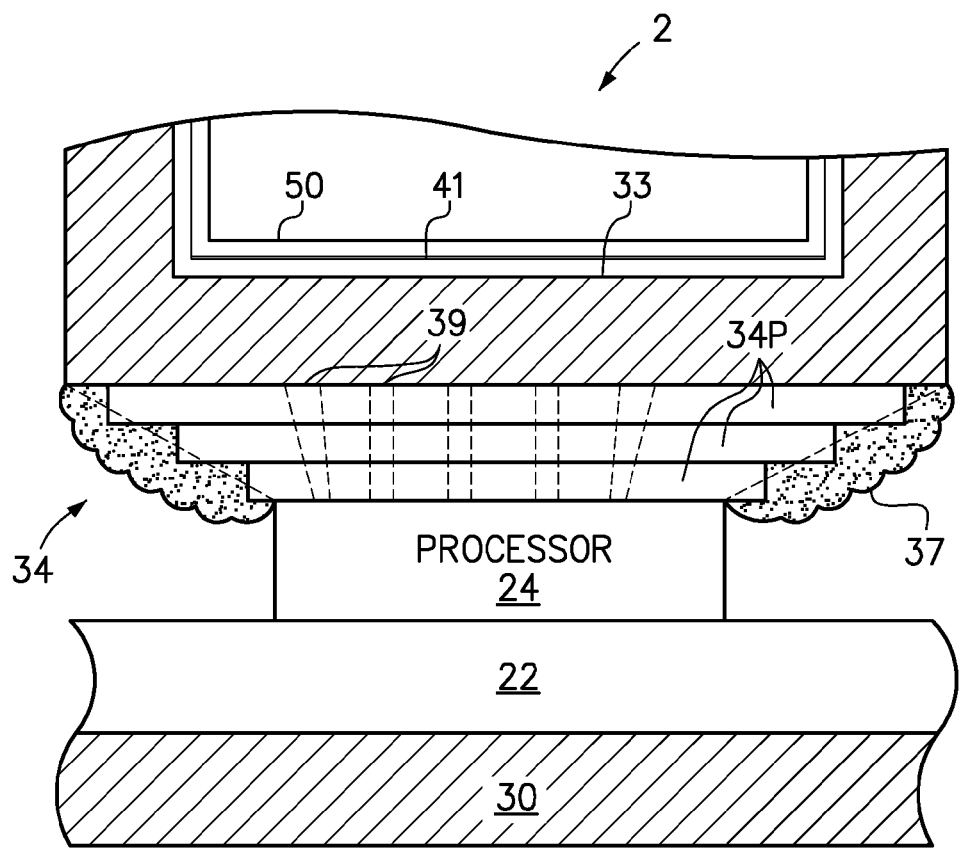
FIG. 2 is an enlarged view of a region of FIG. 1 illustrating an example of a thermal bridge used to fill a gap between the processor and the housing.

FIG. 2 is an enlarged view of the region 2 of FIG. 1 illustrating an example of a thermal bridge 34 used to fill a gap between the processor 24 and the housing 30 to facilitate heat transfer from the processor 24 to the housing 30. The thermally-conductive structure 34 fills a gap between the processor 24 and the recessed channel wall 33 of the U-shaped channel in the housing. The thermal bridge 34 may have a relatively narrow base where it contacts the processor 24 and progressively widens in a direction toward the recessed channel wall 33 to dissipate heat over an increased surface area. However, a thermal bridge could also have other profiles, such as straight sides that do not progressively widen. In this embodiment, the thermal bridge 34 comprises a stack of plates 34P that progressively widen from the processor 24 to the recessed channel wall 33 of the housing 30. In an alternative embodiment, a solid block may be used that widens from a lower end at the processor 24 to a wider end at the recessed channel wall 33. In a still further embodiment, the thermal bridge 34 may include one or more heat pipe. The conduit 50 may directly thermally contact the recessed channel wall 33. A thermally conductive material 38 such as a thermal grease may also be applied at an interface between the conduit 50 and the recessed channel wall 33 to maximize conductive heat transfer. An insulating material 37 is optionally provided around the thermally-conductive structure 34 to maximize conductive heat transfer from the processor 24 to the housing 30 rather than to appreciably heat any static air inside the server housing 30.

A plurality of internal perforations 39 are optionally provided, at least some of which may increase in size through each conductive plate 36, may also help disperse heat. Whereas a conventional processor heat sink may include a plurality of spikes projecting orthogonally or perpendicularly to the processor, the optional internal perforations 39 in the thermal bridge 34 comprise material removed from otherwise solid plates or a solid block, where the perforations extend orthogonally or perpendicularly to the processor 24. In an embodiment where the cooling fluid is air, the perforations may act as chimneys that release hot air into the channel. However, if an embodiment where the cooling fluid is a liquid, any such perforations should be covered and isolated from the channel.

In still another embodiment, the U-shaped channel may be omitted, and the conduit may directly contact an outer surface of the server housing. In that case, the thermally-conductive structure may be made taller to fill a larger gap that would occur between the server housing and the processor or other heat-generating component.

Figure 3:
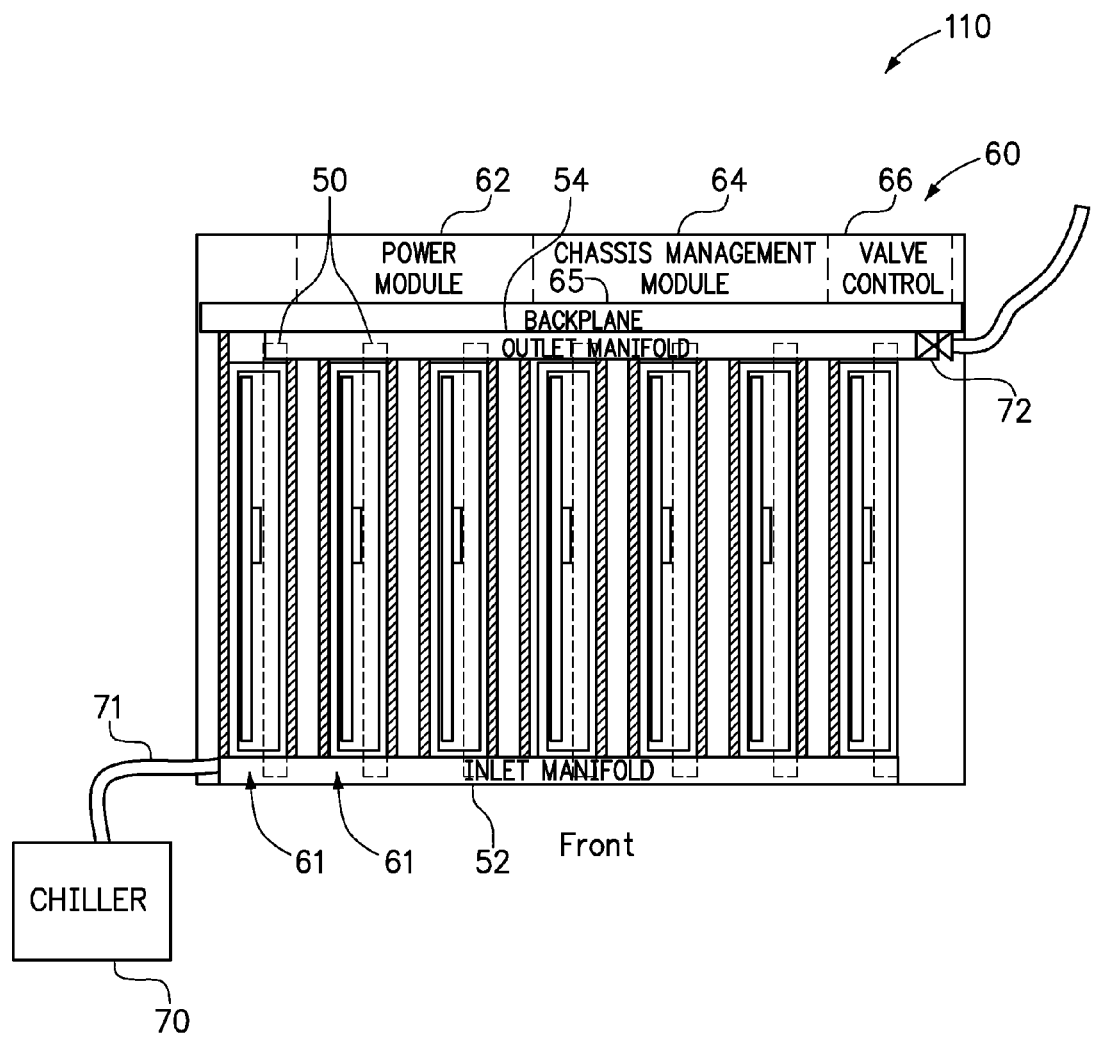
FIG. 3 is a top view of another computer system embodiment that includes a multi-server chassis with an integrated system of fluid conduit for externally cooling a plurality of servers.

FIG. 3 is a top view of another rack-mountable computer system embodiment 110 (drawing not to scale) that includes a multi-server chassis 60 with a network of fluid conduits 50 for externally cooling a plurality of servers 20. The chassis 60 provides shared resources such as power for all blade servers, reduces cabling, and provides a single interface for system management. The type of servers 20 in this embodiment may be blade servers, which are thin, modular servers, each containing one or more processors, memory, integrated network controllers, an optional Fiber Channel host bus adaptor (HBA) and other input/output (IO) ports. Rather than mounting the servers 20 directly on the rack rails 12 (see FIG. 1), the multi-server chassis 60 is mounted on the rack rails 12 and the servers 20 are inserted into server bays 61 in the chassis 60. The servers 20 may be interconnected by electrical connectors on a chassis backplane 65, which provides power and data communication between the servers and the various support modules. A power module 62 supplies electrical power to the servers 20 through the backplane 65, and the chassis management module 64 is in communication with the servers 20 over a data connection for managing the servers 20. The functions of the management module 64 include, but are not limited to, managing power caps on the servers 20 to enforce a chassis power budget. The management module 64 may also allow for remote management of the chassis 60 over a network.

As with the computer system 10 of FIG. 1, the servers 20 in the computer system 110 of FIG. 3 are cooled entirely by the fluid conduits 50 that externally engage the servers 20. Each fluid conduct 50 extends from front to rear in the chassis 60, with at least one section of conduit 50 thermally engaging each server 20. A liquid inlet manifold 52 is fluidly coupled to one end of the conduit 50 at the front of the chassis and a liquid outlet manifold 54 is fluidly coupled to the other end of the conduit 50 at the rear of the chassis 60. The inlet manifold 52 passes liquid cooling fluid to the conduit 50 under pressure from a chiller 70 through a liquid supply line 71. The chiller 70 provides positive pressure to the cooling fluid, which flows under pressure through the conduits 50 from front to rear of the chassis 60, thus cooling the servers 20 and correspondingly heating the cooling fluid. The heated cooling fluid is exhausted through the outlet manifold 54, whereupon the cooling fluid may be returned to the chiller 70 or disposed as waste water.

One or more valves 72 may be provided on the chassis 60 to control the flow through the conduits 60. In this example, a valve 72 is provided on the outlet manifold. While a fluid pump element in the chiller 70 maintains a positive pressure on the inlet manifold 52, the flow of liquid through the chassis 60 may be regulated by the valve 72 at the outlet manifold 54. A valve control module 66 provided in the chassis may be operatively coupled to the valve to control the opening and closing of the valve 72. The valve control module 66 may regulate a fluid flow rate dynamically selected by the controller (e.g. FIG. 1, controller 40). The controller may be embodied as a circuit and control logic on the chassis management module 64 and/or the processors 24. For example, the processors 24 may report their temperatures or workload to the chassis management module 64 via the backplane 65, and the chassis management module 64 may control the fluid flow rate in response to the temperatures or workload.

Figure 4:
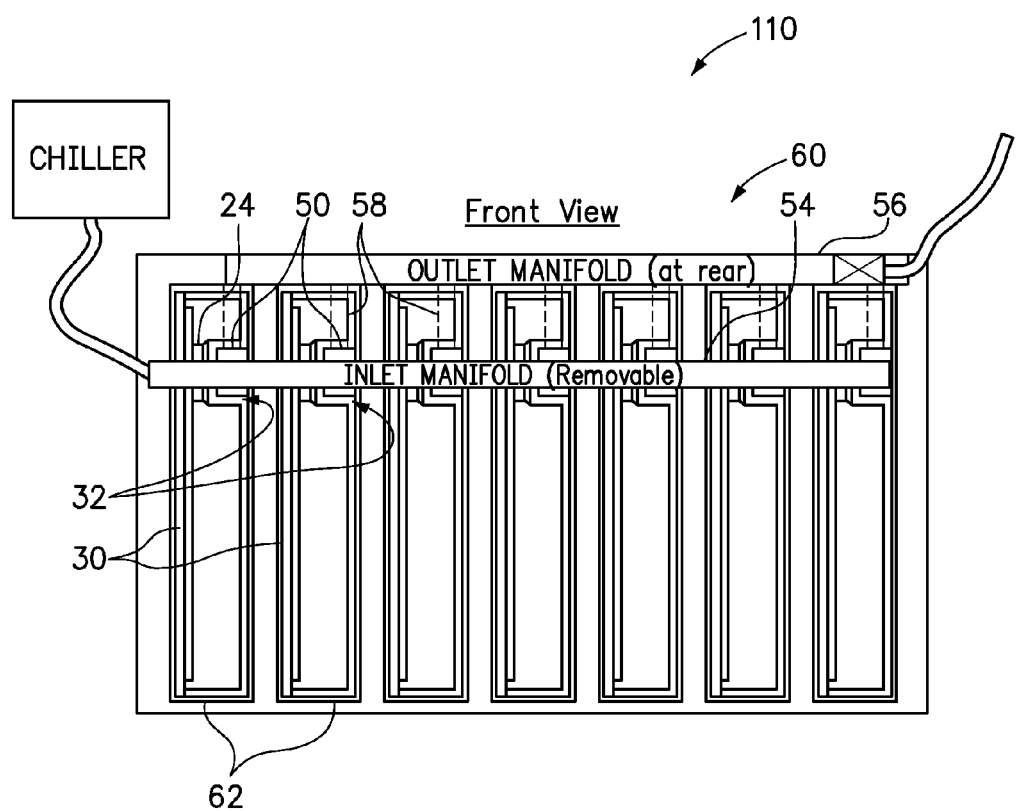
FIG. 4 is a front view of the multi-server chassis of FIG. 3.

FIG. 4 is a front view of the multi-server chassis 60. In this embodiment, the conduit 50 is secured to the chassis 50 in a position to be aligned with the U-shaped channels 32 in the server housings 30 upon insertion of the servers 20 into the server bays 61. When a server 20 is inserted, the channel 32 slidingly receives the respective conduit with the conduit thermally engaging the server housings 30. Upon insertion of a server 20 to a fully inserted position, the conduit 50 may contact the server housing 30 along its entire length, passing over the processor 24. Although only one processor 24 is shown in each server 20, a plurality of heat-generating components may be aligned with the channel 32, such as one or more additional processors, one or more memory modules, and so forth. Thus, the fluid flowing through the conduit 50 cools all of the heat-generating components in conductive thermal communication with the server housing 30 along the channel 32.

The particular manifold and conduit configuration shown in FIGS. 3 and 4 is provided by way of example only, and may vary between different embodiments. The manifolds are shown at two different heights for ease of illustrating the two different manifolds 52, 54. The inlet manifold 52 couples directly to the ends of the conduit 50. The inlet manifold 52 partially covers the server bays 62 when coupled to the conduit 50 extending between the servers 20, but the inlet manifold 52 is removable for inserting and removing the servers 20. The outlet manifold 54 is toward the rear of the rack (See FIG. 3) and does not interfere with insertion or removal of the servers 20. Vertical portions of conduit 58 are provided at the rear of the chassis 60 to fluidly couple the main sections of conduit 50 to the outlet manifold 54. The vertical portions of conduit 58 also avoid interference with the servers 20 by being positioned toward the rear of the chassis 60. In an alternative configuration, the outlet manifold 54 could be positioned at the same height as the inlet manifold 52 and coupled directly to the conduits 60 opposite the outlet manifold 54.

The conduit 50 and any manifolds are not required to be part of the chassis 60. In yet another embodiment, the conduit 50 and manifolds 52, 54 may be structurally separate from the chassis 60, and may be installed through the chassis 60 and the U-shaped channels 32 after the servers 20 have been inserted into the chassis 60. Alternate fluid attachments may be substituted for manifolds as well, such as individual hose fittings coupled to the ends of the conduit 50.

The above description of fluid routing using conduit and manifolds is provided by way of example, and it not intended to limit other fluid-routing configurations. For example, in a still further embodiment, a conduit may include out-and-back fluid pathways that enable the inlet manifold and the outlet manifold to both be near the back of the chassis to avoid interference with server access.

Figure 5:
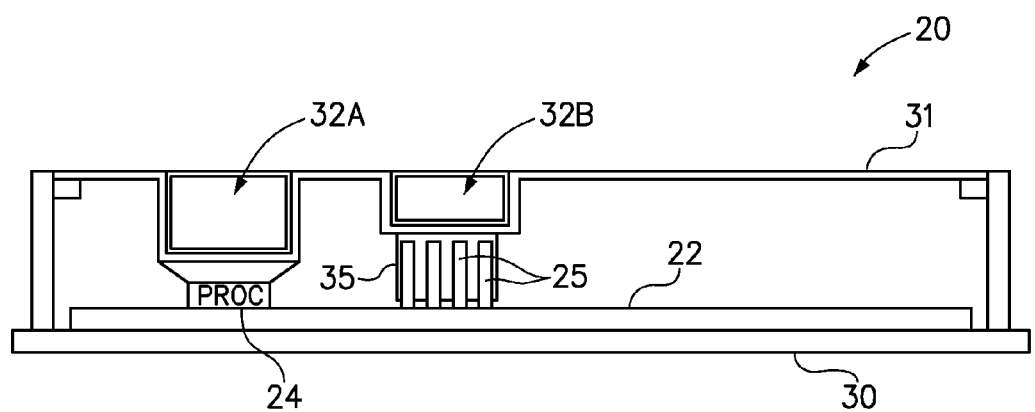
FIG. 5 is a side view of an alternate embodiment of the server wherein the server housing includes a removable top cover and multiple U-shaped channels defined by the top cover.

FIG. 5 is a side view of an alternate embodiment of the server 20 wherein the server housing 30 includes a removable top cover 31 and multiple U-shaped channels 32A, 32B defined by the top cover 31. The removable top cover 31 is releasably secured to the rest of the server housing 30 using any suitable mechanical attachment. The system board 22 is contained within a cavity of the server housing 30. The top cover 31 closes and optionally forms an air-tight seal with the rest of the server housing 30 to prevent the intrusion of dust and other contaminants into the server housing 30. The removable to cover 31 allows access to the system board 22 and components thereof for servicing the server 20 and components thereof.

The removable top cover 31 includes the first U-shaped channel 32A positioned directly over the processor 24 and the second U-shaped channel 32B positioned directly over system memory comprising a plurality of dual in-line memory modules (DIMMs) 25. Although the processor 24 may be the hottest running component in the server 20, the memory modules 25 may also generate a substantial amount of heat. A first conduit 50A is positioned in the first U-shaped channel 32A in thermal communication with the processor 24, as discussed above. A second conduit 50B is positioned in the second U-shaped channel 32B in thermal communication with the DIMMs 25. A thermally-conductive structure 35 is specifically configured for use with the DIMMS 25 to thermally bridge the DIMMs 35 to the server housing 30. The thermally-conductive structure 35 has a comb-shaped or fork-shaped cross-section with a plurality of tines or prongs that are inserted between the DIMMs 25 and thermally engage memory chips on the DIMMs 25. Thus, heat is conducted from the DIMMs 25 to the second fluid conduit 32B.

Figure 6:
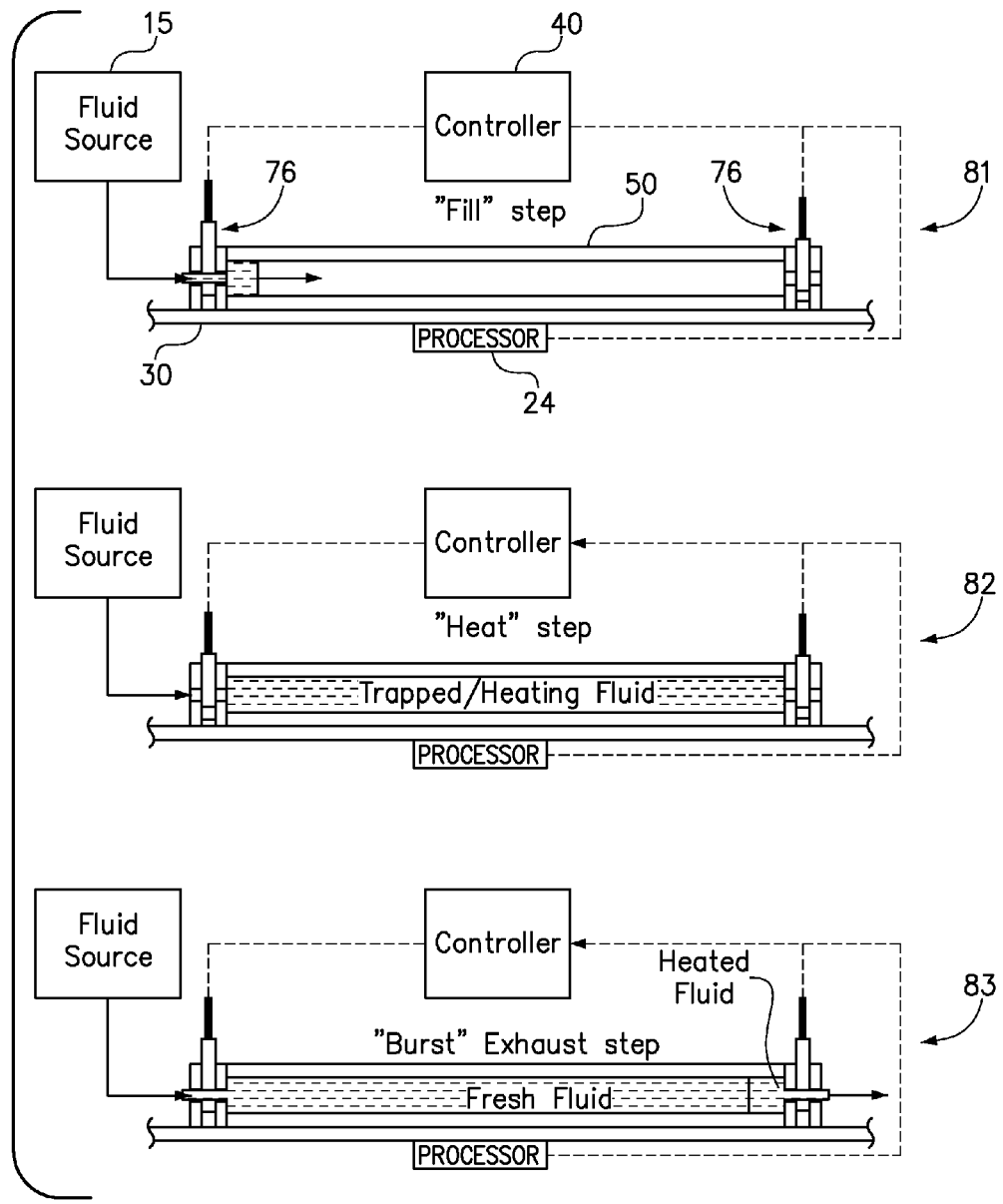
FIG. 6 is a schematic diagram sequentially illustrating an alternative burst exhaust cooling mode.

A method of cooling was described above wherein a continual fluid flow rate is varied in response to a system parameter such as a temperature, power consumption or workload. FIG. 6 is a schematic diagram of the conduit 50 thermally engaging the server housing 30, sequentially illustrating an alternative "burst exhaust" cooling mode. In the burst exhaust cooling mode, rather than varying a continual fluid flow rate, a predefined volume of fluid is drawn into the conduit 50, trapped for a period of time while the predefined volume of fluid absorbs heat from the processor or other server component to be cooled, and is then released to suddenly exhaust the waste heat (i.e. a burst exhaust) in the heated fluid. A variety of different equipment such as different types of valves and control elements may be suitable for implementing the burst exhaust cooling mode illustrated in FIG. 6. By way of example, the burst exhaust cooling mode is implemented here using a valve 76 at each of an upstream and downstream end of the conduit 50. The controller 40 is in communication with the processor 24 and the valves 76. As described previously, the controller 40 may include one or more control elements at different locations in the system, such as on the system board 22, within the processor 24, or on a chassis management module. Here, the controller 40 includes or is otherwise in communication with the processor 24, and controls the opening and closing of the two valves 76.

The burst exhaust cooling mode is sub-divided into three primary steps which are a Fill step 81, a Heat step 82, and a Burst Exhaust step 83. In the Fill step 81, the upstream gate valve 76 is opened while the downstream gate valve 76 remains closed. Water or other fluid is flowed from a fluid source 15 into the conduit 50 to fill the conduit 50 with a predetermined volume of fluid. The upstream gate valve 76 is then closed to trap the predetermined volume of fluid in the conduit 50. While the fluid is trapped, the fluid absorbs heat from the processor 24 during the Heat step 82. The system may use a timer to control how long the fluid remains trapped before releasing it. Alternatively, a temperature sensor may be used to sense a rising temperature of the trapped fluid or a falling temperature of the processor 24, and the fluid may be release when a temperature threshold is reached. In the Burst Exhaust step 83, the downstream gate valve 76 is opened fully to quickly release the trapped fluid. The upstream gate valve 76 may be opened simultaneously to allow a new predefined quantity of "fresh" fluid from the fluid source 15 to enter the conduit 50 before the downstream gate valve 76 is closed to trap the new quantity of fresh fluid. The upstream gate valve 76 may be redundant to some systems wherein sufficient positive pressure is provided from the fluid source 15, but both gate valves 76 are included here to emphasize that the fluid may be trapped within the conduit 50 during the Heat step. The Heat step and Burst Exhaust step may be repeated cyclically to continually absorb heat from the processor 24 and then to release the absorbed heat.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A rack-mounted computer system comprising:
   at least one rack-mountable server having a system board with at least one processor and an enclosed server housing containing the system board, the server housing comprising a channel including a channel wall in conductive thermal communication with the processor; and
   an elongate conduit comprising a thermally conductive material defining an internal fluid flow passage, wherein the conduit is received in the channel of the server housing with the conduit in conductive thermal communication with an external surface of the channel wall.

2. The apparatus of claim 1, further comprising:
   a source of cooling fluid in fluid communication with the elongate conduit; and
   a cooling fluid mover configured for providing forced convection of the cooling fluid externally to the server through the elongate conduit.

3. The apparatus of claim 2, wherein the cooling fluid mover comprises:
   a modular fan coupled to the internal fluid flow passage of the elongate conduit, wherein the cooling fluid source comprises ambient air.

4. The apparatus of claim 2, wherein the cooling fluid mover comprises:
   a pressurized liquid supply line coupled to the internal fluid flow passage, wherein the cooling fluid source comprises a pressurized liquid supplied by the pressurized liquid supply line.

5. The apparatus of claim 2, further comprising:
   an electrical connector connecting the system board inside the server to the cooling fluid mover outside the server, wherein the electrical connector includes one or both of a power connection and a data connection.

6. The apparatus of claim 5, further comprising:
   a controller on the system board configured for dynamically selecting a cooling fluid flow rate as a function of a system parameter of the server and communicating flow rate control signals to the fluid mover for enforcing the dynamically selected cooling fluid flow rate.

7. The apparatus of claim 6, further comprising:
   a temperature sensor internal to the server, wherein the controller on the system board is in electronic communication with the temperature sensor and controls the cooling fluid flow rate in response to a temperature measured by the temperature sensor.

8. The apparatus of claim 2, further comprising:
   a valve configured for selectively opening and closing fluid flow to the conduit; and
   a valve controller configured for providing a burst exhaust cooling mode wherein the valve is cycled between a closed position for a period of time while cooling fluid in the conduit absorbs heat from the processor and an open position for quickly releasing the heated cooling fluid.

9. The apparatus of claim 1, further comprising:
   a thermally conductive bridge inside the server thermally conductively coupling the processor to the recessed channel wall of the server housing.

10. The apparatus of claim 1, wherein the thermally conductive bridge comprises:
    a plurality of plates stacked in order of increasing surface area from the processor to the server housing.

11. The apparatus of claim 1, wherein the thermally conductive bridge comprises:
    a block tapering outwardly from a first surface area where the block thermally engages the processor to a second, larger surface area where the block thermally engages the server housing.

12. The apparatus of claim 9, wherein the thermally conductive bridge further comprises:
    a plurality of through holes extending longitudinally from the processor to the server housing.

13. The apparatus of claim 12, wherein the plurality of through holes taper outwardly from the processor toward the server housing.

14. The apparatus of claim 1, wherein the server housing is sealed from ambient airflow.

15. The apparatus of claim 1, wherein the server housing further comprises a removable top cover that includes the channel.

16. An apparatus comprising:
    a plurality of servers, each server comprising a system board with at least one processor and a server housing enclosing the system board;
    a chassis for receiving the plurality of servers;
    an elongate conduit comprising a thermally conductive material defining an internal fluid flow passage, wherein the conduit is in conductive thermal communication with an external surface of the server housing of each of the plurality of servers; and
    a cooling fluid mover configured for providing forced convection of a cooling fluid through the elongate conduit at a sufficient flow rate to cool the plurality of servers without any appreciable airflow into the plurality of servers.

* * * * *